United States Patent

Malkemes et al.

Patent Number: 5,708,681
Date of Patent: Jan. 13, 1998

[54] HYBRID ANALOG/DIGITAL METHOD AND APPARATUS FOR CONTROLLING THE TRANSMISSION POWER LEVEL OF A RADIO TRANSCEIVER

[75] Inventors: Robert C. Malkemes, Bricktown; Robert A. Ziegler, Red bank, both of N.J.

[73] Assignee: Bell Communications Research, Inc., Morristown, N.J.

[21] Appl. No.: 631,784

[22] Filed: Apr. 23, 1996

[51] Int. Cl.$^6$ .............................. H04L 25/49; H04L 27/20
[52] U.S. Cl. ..................... 375/297; 375/296; 375/308; 455/72; 455/127; 370/535
[58] Field of Search .......................... 375/260–261, 375/279–281, 284, 285, 295–298, 308; 455/72, 127; 370/535; 332/103

[56] References Cited

U.S. PATENT DOCUMENTS

| | | |
|---|---|---|
| 4,412,337 | 10/1983 | Bickley et al. ............ 375/297 |
| 5,129,098 | 7/1992 | McGirr et al. ............ 455/127 X |
| 5,159,283 | 10/1992 | Jensen ....................... 455/127 X |
| 5,193,223 | 3/1993 | Walczak et al. .......... 455/127 X |
| 5,293,407 | 3/1994 | Shibata ...................... 375/297 |
| 5,369,789 | 11/1994 | Kosugi et al. ............ 455/127 X |
| 5,383,223 | 1/1995 | Inokuchi ................... 375/297 |
| 5,507,017 | 4/1996 | Whitmarsh et al. ...... 455/127 X |

FOREIGN PATENT DOCUMENTS

WO92011705 A 7/1992 WIPO ........................ 455/127

Primary Examiner—Young T. Tse
Attorney, Agent, or Firm—James W. Falk; Joseph Giordano

[57] ABSTRACT

A technique for controlling the transmission power level of a transmitter, particularly in a wireless personal communication system, is disclosed. This technique assists in the prevention of interference between transceivers from degrading the quality of transmissions. Transmission power level is controlled through a hybrid circuit containing both digital and analog electronics. The transmission power level is set by controlling both the amount by which a data stream is compressed and the gain of an analog transmit power amplifier. This approach allows adequate control over the transmission power level; it avoids the need for utilizing excessively wide data paths for the digital transmit signals (which may compromise portable terminal battery consumption), or utilizing expensive, hard-to-calibrate analog electronics.

11 Claims, 5 Drawing Sheets

HYBRID ANALOG/DIGITAL METHOD AND APPARATUS FOR CONTROLLING THE TRANSMISSION POWER LEVEL OF A RADIO TRANSCEIVER

FIELD OF THE INVENTION

The present invention relates to the field of personal wireless communication devices and the problems that arise when such devices interfere with one another. Since many contemporary wireless communication systems are limited by in-system interference, mechanisms to control that interference can improve system traffic capacity or reduce spectrum requirements. Specifically, the present invention relates to the field of controlling the transmission power level of a personal wireless communication device to help prevent interference by and with other devices emitting radio signals.

BACKGROUND OF THE INVENTION

In the rapidly emerging field of personal wireless communications, a number of digital radio-based systems have been developed for transmitting calls and data to people who subscribe to the system. 'High-tier' wireless systems, based on cellular radio concepts, typically use relatively expensive base station towers to communicate with individual radio transceivers used by subscribers over a radius of several miles.

More recently, 'low-tier' radio standards have been developed that are capable of supporting significantly higher traffic densities than are generally feasible with high-tier technologies. The low-tier systems use small, inexpensive base stations that each service a relatively small area. One advantage of low-tier systems is the ease with which such small, inexpensive base stations can be readily and widely deployed, e.g. in buildings or on utility poles, to enable high capacity wireless access service.

As personal wireless communication systems continue to grow in popularity, the density of subscribers continues to increase. As the density of subscribers increases, the problem of interference between the transceivers used by subscribers will limit the expansion of personal wireless communications unless the interference can be controlled.

A principal means of controlling interference between transceivers is by regulating the level of power at which an individual transceiver transmits. The standards established for some emerging wireless systems have included requirements that participating transceivers be capable of regulating the power level at which they transmit over a given range.

For example, the Personal Access Communications System (PACS) is one of the emerging low-tier wireless system standards. PACS may prove to be a particularly important system in developing countries now served by inadequate communication systems. Because PACS is such a cost-effective wireless technology it may come to be heavily relied upon for both personal and business communication needs.

According to the operating standards for PACS, a transceiver must be able to adjust its transmission power level in response to a power control signal sent by the system. The transceiver must be able to adjust its transmission power level over a range of 30 dB in steps of 1 dB with an error of not more that ±0.5 dB. See American National Standards Institute J-STD-014, *Personal Access Communication System Air Interface Standard*, 4.3.4 (1995) the disclosure of which is incorporated herein by reference. Other systems have required similar transceiver capabilities.

In addition to reducing interference between transceivers, controlling the transmission power level reduces power consumption and increases the life of the battery pack which powers a transceiver. However, producing a small, inexpensive transceiver with the electronics necessary to implement such transmission power level control over such a wide range and with such accuracy is difficult.

As previously stated, reducing the transmission power level to the minimum necessary to maintain a radio link of sufficient quality provides both system benefits (i.e. increased teletraffic capacity) and individual portable transceiver benefits (i.e. reduced power drain on the battery pack). All transceivers must employ analog electronics to produce radio frequency power for transmission to the base station by the transceiver antenna. However, the electronics used to control the transmission power level may be purely analog, purely digital, or a combination of both.

A purely analog method, such as adjustment of the power gain of the final transmit amplifier, could provide additional reductions in battery consumption, but purely analog approaches are difficult to implement. Substantial complexity may be required to meet transmit power level accuracy requirements, especially over a range of temperatures. Additionally, if a purely analog method is used, significant cost may be required to individually calibrate manufactured transceivers to verify the accuracy of their transmission power control.

Purely digital methods, by contrast, may be significantly more robust over varying environmental conditions (e.g. temperature). Furthermore, purely digital methods may not require the expensive calibration that purely analog methods do. Thus, transceivers using a purely digital method to control transmission power may have considerable advantage in achieving reliable, high-volume, low-cost manufacture.

An example of a purely digital method would entail digital adjustment of the transmit signal range (e.g., a digital compression or amplification method) immediately prior to a digital-to-analog conversion in the transmit chain. In such a technique, the absolute digital-to-analog conversion parameters (number of resolution steps, maximum peak-to-peak analog signal swing) and the gain of the following analog power generation stages are fixed.

FIG. 1 outlines a straightforward digital compression scheme for transmission power control. Assuming linearity of the following (fixed) analog stages, the transmit power level is proportional to the square of the amplitude of the analog waveform x(t) produced by a digital-to-analog converter 2.

To achieve a final power compression of up to M dBs, the minimum value of the compression factor g(k) is determined by:

$$g_{min} = 10^{(-M/20)}$$

Use of a purely digital method also has drawbacks. First, the need for reasonable fidelity in the spectral shape of the transmitted signal implies a minimum resolution (i.e., a minimum number of quantization steps) in the digital signal path prior to digital-to-analog conversion. However, the use of a digital compression method will increase the required transmit data path width required to produce the minimum number of quantization steps.

With reference to FIG. 1, if q bits are used to represent the fluctuations of the digital transmit waveform, then at the minimum transmit power level, which corresponds to maximum digital compression, the digital waveform s(k) can only fluctuate over the range:

$$0 \leq s(k) < g_{min} \times 2^q$$

The effective resolution is limited to:

$$q_{eff} = \log_2(g_{min} \times 2^q)$$

$$= q - M \times (\log_2 10)/20$$

$$= q - M/6$$

where M is expressed in dB.

For M=30 dB maximum compression, the effective resolution would then be only about q−5 bits, and spectral quality may be unacceptably degraded. Conversely, if we desire at least q bits of resolution at maximum compression, then the data path width must be at least q+5 bits. The cost of data conversion solutions increases rapidly with this magnitude of increase in data path width requirements.

Another problem with purely digital methods is the lack of assurance that the required analog amplifier and RF power generation stages would operate efficiently over the wide range of input signals that would be required to meet transmit power control specifications for wireless system standards such as PACS. Additionally, even if they could operate reasonably over a such a wide range of input levels, they may not provide all of the battery consumption improvements possible with an analog method such as power amplifier gain control.

For these reasons, there is a need for an effective, affordable hybrid circuit employing both digital and analog elements to control the transmission power level of a transceiver in a personal wireless communication system over a specified range.

SUMMARY OF THE INVENTION

It is an object of the present invention to meet the above-stated need and others. More specifically, it is an object of the present invention to provide an affordable hybrid analog/digital circuit which may be used to regulate the transmission power level over a defined range in a transceiver for use with a wireless personal communication system.

Additional objects, advantages and novel features of the invention will be set forth in the description which follows, and will become more apparent to those skilled in the art upon examination of the following or may be learned by practice of the invention. The objects and advantages of the invention may be realized and attained by means of the instrumentalities and combinations particularly pointed out in the appended claims To achieve the stated and other objects of the present invention, as embodied and described below, the invention may comprise the steps of:

- compressing a digital signal that is to be transmitted by multiplying the digital signal by a first predetermined value;
- modulating a carrier signal based on the compressed digital signal;
- inputting the modulated carrier signal to a transmission power amplifier;
- adjusting the gain of the amplifier on the basis of a second predetermined value; and
- transmitting the amplified modulated carrier signal.

The first and second predetermined values may be derived from a digital transmission power level control word. The digital transmission power level control word comprises n bits. The first predetermined value is derived from k bits of the n bits, where k<n; and the second predetermined value is derived from the remaining n−k bits of the n bits.

The first predetermined value may be derived by applying the correct part of the transmission power level control word to a look-up table which produces the first predetermined value in response.

The digital signal is generated by applying a bit stream to a modulation information symbol mapper. The symbol mapper may convert bits to binary modulation symbols, or in the case of contemporary digital systems like PACS, a quadrature symbol mapper may output an in-phase and a quadrature baseband digital signal.

If a quadrature symbol mapper is used, both the in-phase and quadrature signals are compressed, converted to analog signals, quadrature modulated to radio frequency, and transmitted. The quadrature symbol mapper may also produce a single modulated intermediate frequency signal which is then compressed, upconverted to the desired radio frequency and transmitted.

Furthermore, the in-phase and quadrature pair of signals may be multiplexed before compression and conversion to analog. Demultiplexing is performed before the signals are applied to the quadrature modulator.

BRIEF DESCRIPTION OF THE DRAWINGS

The accompanying drawings, which are incorporated in and form a part of the specification, illustrate the present invention and, together with the description, serve to explain the principles of the invention. In the drawings.

DETAILED DESCRIPTION OF THE PREFERRED EMBODIMENT

Methods are known for establishing the transmission power level at which a radio transceiver should be transmitting given the interference from other transceivers and other radio sources in the area. One such method is described in Ariyavisitakul et al U.S. Pat. No. 5,333,175, Jul. 26, 1994, which is incorporated herein by reference.

U.S. Pat. No. 5,333,175 teaches a TDM/TDMA portable radio communications system in which the uplink power transmitted by the transmitter of a portable unit to a fixed radio access port is dynamically controlled by monitoring three measures in each uplink burst received by the port. These measures are a received signal strength indicator (RSSI), a measure of received signal quality derived from the demodulation circuitry ("quality measure"), and a codeword error indicator.

The word error indicator is used to adjust an RSSI threshold upward and downward. If the quality measure is below a predetermined threshold or the RSSI is below the current value of the adjustable RSSI threshold, then additional uplink power is required, unless the RSSI is greater than a predetermined maximum value. If additional power is required, a power control bit, included within each downlink burst transmitted to the portable, is set to ONE and the portable, in response thereto, increases its output transmitter power by a controlled amount.

If the quality measure is greater than the predetermined quality measure threshold and the RSSI is greater than the RSSI threshold, the power control bit is set to zero and the portable power transmitter power is decreased by a controlled amount. Also, if the RSSI is greater than the predetermined maximum, the power control bit is set to zero and the portable power transmitter power is decreased.

After using the method of U.S. Pat. No. 5,333,175 or any other method of determining the appropriate power level for a portable transceiver, electronics must be provided to constrain the transceiver to broadcast at that power level. This is the problem addressed by the present invention. Using the drawings, the preferred embodiments of the present invention will now be explained.

Figure 1:
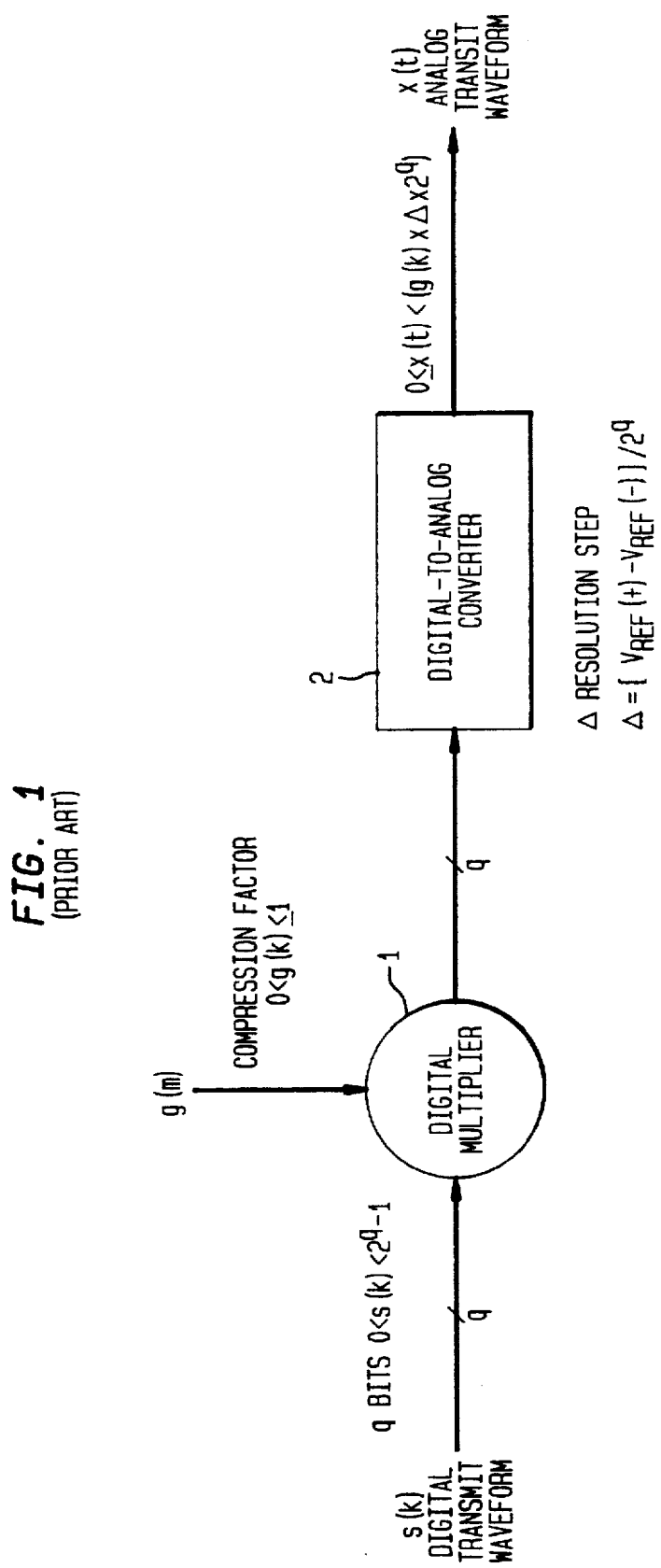
FIG. 1 is a block diagram of a prior art circuit using digital techniques to adjust transmission power.
Figure 2:
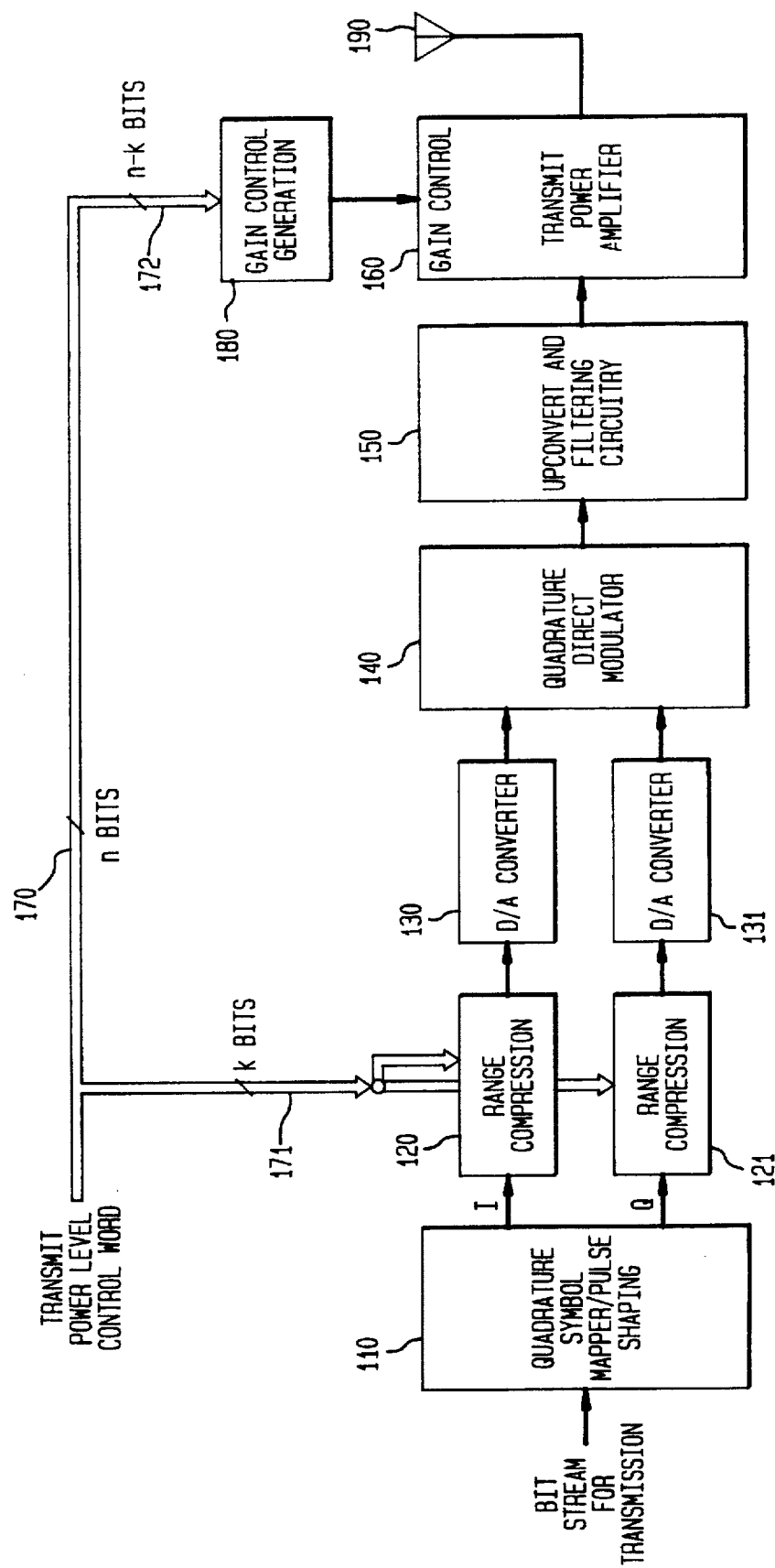
FIG. 2 is a block diagram of the circuit of the present invention using a baseband quadrature modulation of the bit stream.

As shown in FIG. 2, a bit stream is prepared for transmission. The bit stream may be a sequence of digital codewords corresponding to the digitized speech of a subscriber speaking into a transceiver. The bit stream is first processed by a quadrature symbol mapper 110. The quadrature symbol mapper 110 translates the digital bit stream into a pair of baseband digital waveforms (the "I" or in-phase and "Q" or quadrature signals) that may be digitally filtered to realize particular spectrum characteristics.

To ensure good spectrum fidelity during transmission, these signals are sampled at a relatively high rate compared to the rate of information symbol generation. As a general rule, the baseband I and Q signals should be sampled at a rate at least eight times the rate that information symbols are transmitted.

The I and Q signals are then identically compressed by range compression devices 120 and 121, respectively. Compression is accomplished by multiplying both the I and Q signals by some number greater than zero and less than or equal to 1. This uniformly decreases the amplitude of the I and Q signals and, presuming monotonic (i.e. unsaturated) behavior of the following analog intermediate- and radio-frequency circuitry, decreases the power level of the radio-frequency signal that is ultimately transmitted.

The transmit power level control word 170 is determined by the optimal level of power at which the transceiver should be transmitting, given the propagation conditions and the interference in the area. The means of determining that optimal level are not a subject of this invention (see for example U.S. Pat. No. 5,333,175). However, once determined, the transmit power level control word 170 is used by the electronics of the present invention to effect the proper transmission power level for the transmission.

In the example of FIG. 2, some of the n bits of the transmit power level control word 170, that is k bits 171, are used to index the number by which the range compression devices 120 and 121 will multiply the I or Q signals to effect compression. In this example, the same number is used by both compression devices 120 and 121 to identically compress the I and Q signals. These k bits constitute the range compression control word 171.

The compressed digital I and Q signals are then applied to digital-to-analog converters 130 and 131. The compressed analog I and Q signals are then modulated to an intermediate frequency using a standard quadrature modulator 140. The intermediate frequency is upconverted and filtered by circuit 150 into a radio frequency signal.

The radio frequency signal is then applied to the transmit power amplifier 160. The gain control 180 for the amplifier 160 is determined by the remaining bits (n−k) in the transmit power level control word 170. These (n−k) bits constitute the amplifier gain control word 172. To maintain the linearity of the amplifier, it may also be necessary to adjust other aspects of the amplifier's operations such as the gate bias control. After compression and appropriate amplifier gain control, the radio frequency signal, now constrained to the appropriate transmission power level, is transmitted by the antenna 190.

Alternatively, the intermediate frequency processing may be omitted. The quadrature modulator 140 is configured to produce a radio frequency signal instead of an intermediate frequency signal. If this approach is used, the resulting radio frequency signal is supplied directly to the transmit power amplifier 160.

It will be readily understood by those of ordinary skill in the art that the invention also applies to the use of binary instead of quadrature modulations, and intermediate frequency instead of baseband digital symbol mapper outputs. In both cases only a single digital signal path is required, including range compression and digital-to-analog conversion.

Thus, according to the principles of the present invention, the transmission power level is controlled by adjusting the range compression of the I and Q digital signals and by effecting gain control of the analog amplifier 160 prior to transmission. The digital control achieved through range compression provides small power control steps over a moderate range. The analog control achieved through controlling the gain of the transmit power amplifier 160 provides significantly larger steps of range control and also provides better control of transceiver power consumption.

Each incremental change in the amplifier gain control word produces a large single incremental change in the transmission power level which is on the order of the entire range of transmission power levels that may be effected through controlling signal compression alone. Thus, changes in the amplifier gain control word produce large jumps in transmission power level while changes in the range compression control word produce smaller jumps within those large jumps. In combination, the large and small jumps provide the required number of transmission power levels. Thus, the range compression control word 171 and the analog gain control word 172 function as "fine" and "coarse" controls, respectively, to effect the proper transmission power level. The transmission power level can be smoothly adjusted over the full range of available power levels by sweeping the n-bit control word through its range of values.

The amplifier 160, which enables transmission through the antenna 190, presents the most significant demands on the battery that powers the transceiver. Accordingly, it may be advantageous to cluster more of the transmission power levels at lower amplifier gain levels than to have the transmission power levels spread evenly over the range of amplifier gain levels. To achieve this, the large range jumps in transmission power level effected by controlling the amplifier gain could overlap each other. This may require some additional complexity in the logic that generates the transmit power level control word 170 in order to make the appropriate steps in response to particular transmission power control commands.

Figure 3:
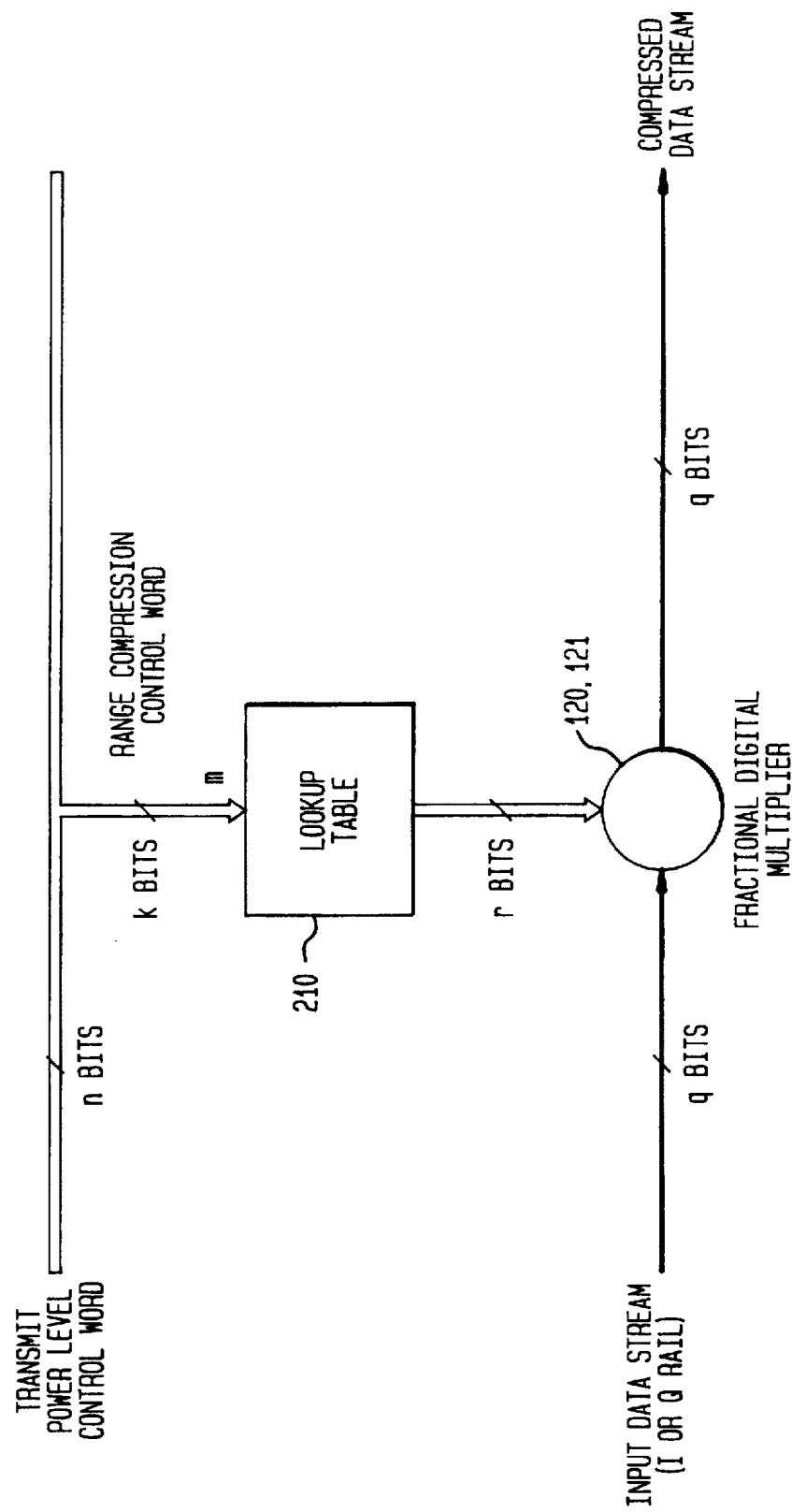
FIG. 3 is a block diagram of the look-up table used with the present invention.

Referring now to FIG. 3, a process of using the range compression control word 171 will be described in more detail. The k bits of the transmit power level control word 171 represent a numeric value m. To determine the multiplier used in compression, the transmit power level control word 171 is applied to look-up table 210. The look-up table 210 produces a predetermined value, $g(m) \leq 1$, which is based on the numeric value m. This look-up value is then applied by the range compression devices 120 and 121 to compress the I and Q signals. By compressing the range of the I and Q signals by a factor of $g(m)$, the power of the signals is compressed by a factor of $g(m)^2$ or $-20\log_{10}(g(m))$ dB.

In summary, according to the principles of the present invention, control of the transmission power level can best be effected by controlling both signal compression and the gain of the transmit power amplifier 160. Absent this two-part control, a much larger data path width would be required to faithfully represent the digital waveform (e.g. with enough resolution) over the required range of transmission power control settings. Moreover, there would be no reduced power consumption.

The transmit power level control word 170 thus contains all the data required to effect the proper transmission power level. A power level control word of n bits can provide $2^n$ different transmission power levels. As mentioned above, the PACS standard requires an transmission power level control range of 30 dB with 1 dB increments. This translates into a mandate for thirty available transmission power levels. Accordingly, in a PACS example, $n \geq 5$ ($2^5=32$).

As noted, the lower k bits of the transmit power control word 170 form the range compression control word 171. This provides $2^k$ transmission power ranges that can be effected by range compression alone. Similarly, the lower n–k bits form the gain control word 172, providing $2^{n-k}$ transmission power levels that, used in combination with the power levels effected through range compression, provide up to $2^n$ transmission power levels.

In a PACS example, choosing k=4 results in 16 ($2^4=16$) transmission power levels (in 1 dB increments) that can be effected through compression of the I and Q signals. With n=5, n–k=5–4=1. Thus there are 2 ($2^1=2$) transmission power ranges that can be effected through regulating the gain of the amplifier 160.

Figure 4:
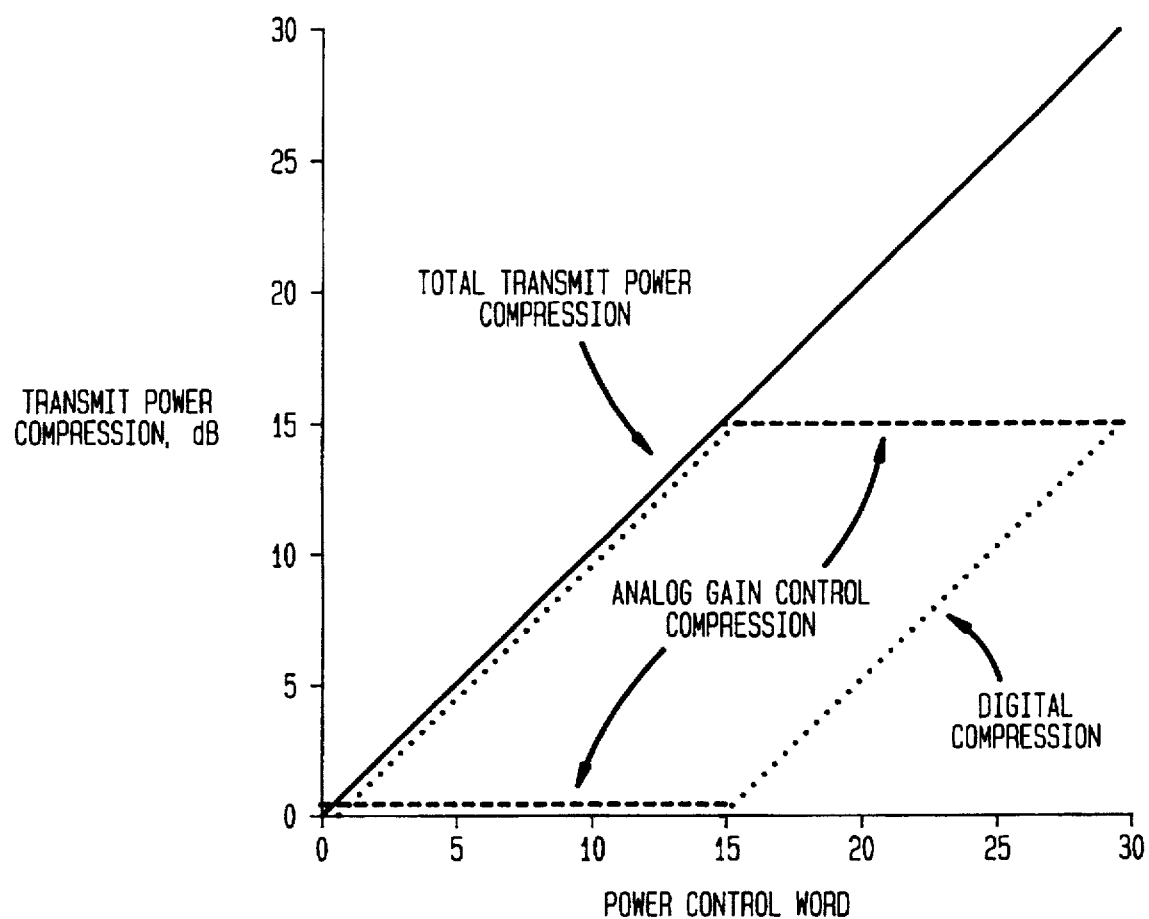
FIG. 4 is a graph of the present invention applied to the transmission power level of a PACS transceiver.

Since there are sixteen transmission power levels available through compression for each of the two levels available through gain control, the total is as many as thirty-two transmission power levels that may be achieved. This satisfies the PACS standard requirement for at least thirty available transmission power levels over a range of at least 30 dB. This relationship is presented graphically in FIG. 4.

In this example, the look-up table 210 would be as follows:

| Power Compression Level, m (dB) | Exact Multiplicand, g(m) (to 4 digits) | 6 bit Multiplicand Approximation, g(m) | Approximation Error (dB) |
|---|---|---|---|
| 0 | 1.0000 | 64/64 | 0.000 |
| 1 | 0.8913 | 57/64 | 0.006 |
| 2 | 0.7943 | 51/64 | –0.014 |
| 3 | 0.7079 | 45/64 | 0.059 |
| 4 | 0.6310 | 40/64 | 0.041 |
| 5 | 0.5623 | 36/64 | –0.002 |
| 6 | 0.5012 | 32/64 | 0.010 |
| 7 | 0.4467 | 29/64 | –0.124 |
| 8 | 0.3981 | 25/64 | 0.082 |
| 9 | 0.3548 | 23/64 | –0.111 |
| 10 | 0.3162 | 20/64 | 0.052 |
| 11 | 0.2818 | 18/64 | 0.018 |

-continued

| Power Compression Level, m (dB) | Exact Multiplicand, g(m) (to 4 digits) | 6 bit Multiplicand Approximation, g(m) | Approximation Error (dB) |
|---|---|---|---|
| 12 | 0.2512 | 16/64 | 0.021 |
| 13 | 0.2239 | 14/64 | 0.201 |
| 14 | 0.1995 | 13/64 | –0.078 |
| 15 | 0.1778 | 11/64 | 0.296 |

If the signal path through the quadrature modulator 140 and the intermediate frequency 150 and radio frequency 160 processing stages is not linear (that is, a change of y dB in the range compression does not result in a change of y dB in the output transmission power), then the look-up table 210 can be adjusted to take this nonlinearity into account.

In FIG. 3, g(m) is indicated as having a data width of r bits and the I and Q signals as each having a data width of q bits. The values of r and q are determined by the particular application. In particular, q is determined by the spectrum fidelity requirements. With fewer bits in q, the range compression devices 120 and 121 and the digital-to-analog converters 130 and 131 are less expensive, but the quality of the transmission spectrum is degraded.

In PACS, for example, an effective resolution width of eight bits results in good spectrum quality. The lowest effective resolution occurs at maximum digital compression, that is at 15 dB power compression. From the look-up table of the PACS example, this results in a multiplicand of 0.1778. Thus, the effective resolution of the I and Q signals is reduced by a factor of $\log_2 (0.1778)$ or about 2.5 bits. This suggests that q should be greater than 10 bits (perhaps 11 or 12, depending on how the digital-to-analog conversion is implemented) to maintain a minimum of eight bits of effective resolution.

Figure 5:
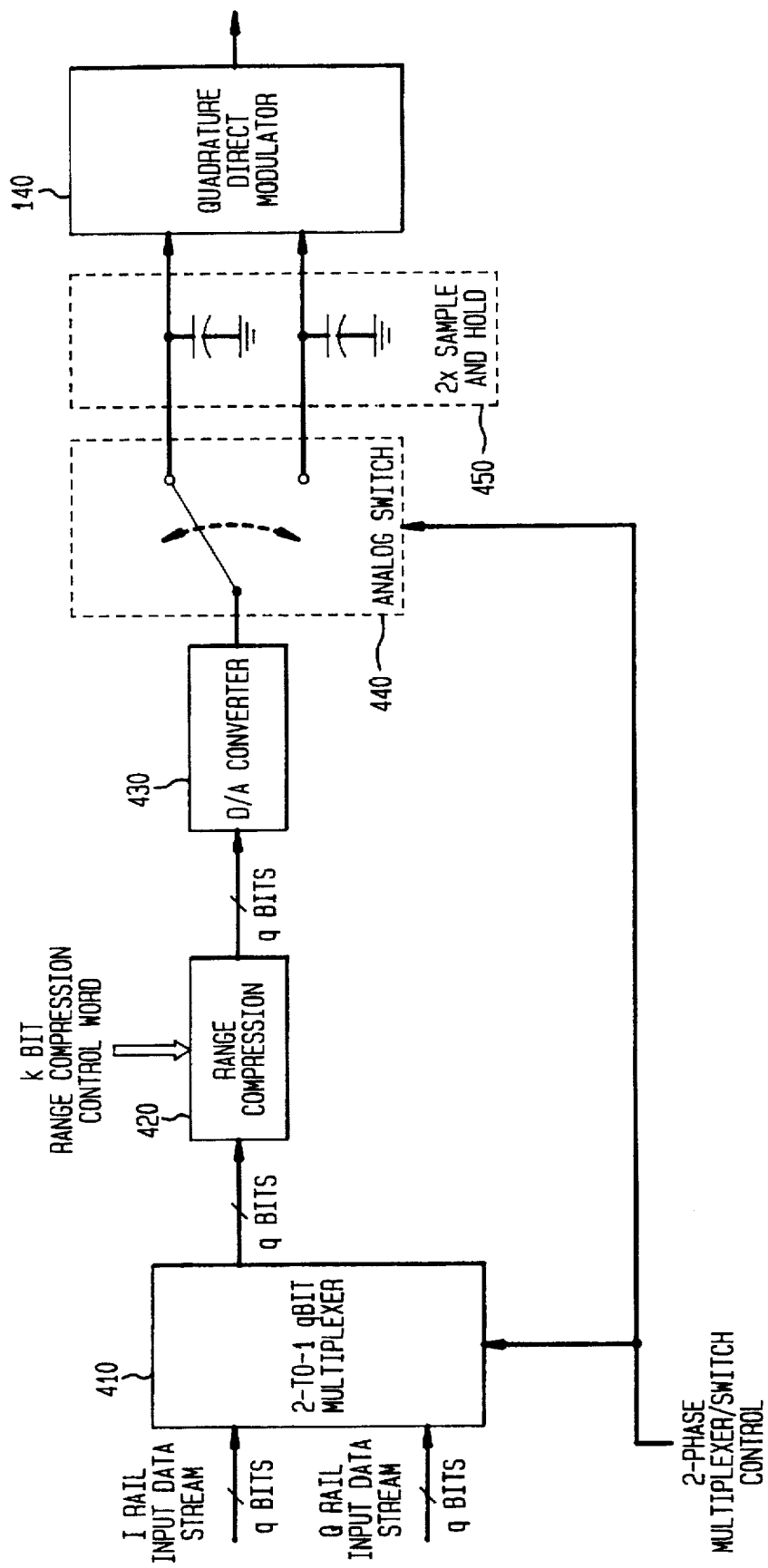
FIG. 5 is a block diagram of a multiplexed range compression and D/A conversion circuit of the present invention using a baseband quadrature modulation of the bit stream.

A second embodiment of the present invention is shown in FIG. 5. In this embodiment, the I and Q signals are applied to a multiplexer 410. The multiplexed signals are applied to a range compression device 420 and then a digital-to-analog converter 430. The multiplexed analog I and Q signals are then demultiplexed by an analog switch 440 and a sample and hold circuit 450 before being applied to a quadrature direct modulator 140.

Only a single range compression device 420 and a single digital-to-analog converter 430 are used thereby reducing the complexity of the circuitry shown in FIG. 2. In order to function with only a single range compression device and a single digital-to-analog converter, the I and Q signals are multiplexed into the range compression device 420 by a 2-to-1 q-bit multiplexer 410. This embodiment requires that the I and Q signals, when produced by the quadrature symbol mapper 110, are clocked out on opposite phases of a sufficiently fast clock.

Though this embodiment eliminates one range compression device and one digital-to-analog converter, the range compression device 420 and the digital-to-analog converter 430 that remain must be able to operate at approximately twice the speed of the range compression devices 120 and 121 and the digital-to-analog converters 130 and 131 shown in FIG. 2. This embodiment also requires the addition of the multiplexer 410 and an analog switch 440 with a sample and hold circuit 450 for demultiplexing the I and Q signals before applying them to the quadrature direct modulator 140. A two phase multiplexer/switch control must also be added to coordinate the action of the multiplexer 410 and the analog switch 440.

The above description has been presented only to illustrate and describe the invention. It is not intended to be exhaustive or to limit the invention to any precise form disclosed. Many modifications and variations are possible in light of the above teaching.

For example, it is possible to configure the quadrature symbol mapper 110 to output a single low intermediate frequency bandpass signal instead of the two separate I and Q baseband signals. Such an arrangement also allows for the use of a single range compression device and a single digital-to-analog converter and allows for the omission of the quadrature direct modulator 140.

The difficulty with this approach is that it requires the intermediate frequency bandpass signal to be sampled at a higher rate in order to preserve spectrum fidelity. For example, as discussed in the embodiment of the invention shown in FIG. 2, the I and Q signals are sampled at eight times the rate of information symbol generation. If the I and Q signals are replaced by a single intermediate frequency bandpass signal, depending on the value of the intermediate frequency chosen, the sampling will have to occur at 16, 32 or even 64 times the symbol generation rate to maintain spectrum fidelity.

The preferred embodiments were chosen and described in order to best explain the principles of the invention and its practical application to enable others skilled in the art to best utilize the invention in various embodiments and with various modifications as are suited to the particular use contemplated. It is intended that the scope of the invention be defined by the following claims.

What is claimed is:

1. A method for controlling the transmission power level of a modulated carrier signal comprising the steps of:
   compressing a digital signal to be transmitted by multiplying said digital signal by a first predetermined value;
   converting the compressed digital signal to an analog signal;
   modulating a carrier signal based on the analog signal;
   inputting the modulated carrier signal to an analog transmission power amplifier;
   adjusting the gain of said transmission power amplifier for the modulated carrier signal on the basis of a second predetermined value; and
   transmitting the amplifier modulated carrier signal;
   wherein said first and second predetermined values are derived from a digital transmission power control word without feedback, said power level control word comprising a plurality of bits and said first and second predetermined values being derived from different combinations of said bits.

2. The method as claimed in claim 1, further comprising the step of applying a bit stream to an information symbol mapper to produce said digital signal and
   wherein said information symbol mapper is a baseband quadrature symbol mapper and the digital signal produced by said baseband quadrature symbol mapper comprises an in-phase digital signal and a quadrature digital signal, and further wherein said step of compressing said digital signal by multiplying said digital signal by the first predetermined value includes multiplying both the in-phase signal and the quadrature signal by the first predetermined value.

3. The method as claimed in claim 2, wherein the step of converting the compressed digital signal to the analog signal includes converting both the in-phase signal and the quadrature signal, said method further comprising the steps of:
   applying the analog in-phase signal and the analog quadrature signal to a quadrature direct modulator;
   producing a single intermediate frequency signal with the quadrature direct modulator;
   upconverting and filtering the intermediate frequency signal to produce a radio frequency signal; and
   applying the radio frequency signal to said analog transmission power amplifier.

4. A method for controlling the transmission power level of a modulated carrier signal comprising the steps of:
   compressing a digital signal to be transmitted by multiplying said digital signal by a first predetermined value;
   modulating a carrier signal based on the compressed digital signal;
   inputting said modulated carrier signal to a transmission power amplifier;
   adjusting the gain of said transmission power amplifier on the basis of a second predetermined value; and
   transmitting the amplified modulated carrier signal;
   said first and second predetermined values being derived from a digital power level control word which comprises n bits, where n is an integer;
   said first predetermined value is derived from k bits of said n bits, where k is an integer that is less than n; and
   said second predetermined value is derived from the remaining n–k bits of said n bits.

5. A method for controlling the transmission power level of a modulated carrier signal comprising the steps of:
   applying a bit stream to an information symbol mapper to produce a digital signal to be transmitted, the information symbol mapper being a baseband quadrature symbol mapper and the digital signal produced by said baseband quadrature symbol mapper comprising an in-phase digital signal and a quadrature digital signal;
   compressing said digital signal by multiplying said digital signal by a first predetermined value, including multiplying both the in-phase and the quadrature signals by the first predetermined value;
   modulating a carrier signal based on the compressed digital signal;
   inputting said modulated carrier signal to a transmission power amplifier;
   adjusting the gain of said transmission power amplifier on the basis of a second predetermined value; and transmitting the amplified modulated carrier; said method further comprising
   multiplexing the in-phase and the quadrature signals prior to said compressing step and converting said signals from digital to analog; and
   demultiplexing the in-phase and quadrature signals following compression and digital-to-analog conversion.

6. A system for controlling the transmission power level of a modulated carrier signal transmitter comprising:
   means for compressing a digital signal to be transmitted by multiplying said digital signal by a first predetermined value;
   means for converting the compressed digital signal to an analog signal;
   means for modulating a carrier signal based on the analog signal;
   means for inputting said modulated carrier signal to an analog transmission power amplifier;
   means for adjusting the gain of said analog transmission power amplifier on the basis of a second predetermined value; and means for transmitting the amplified modulated carrier signal;

wherein said first and second predetermined values are derived from a digital transmission power level control word without feedback.

7. The system as claimed in claim 6, wherein the means for compressing the digital signal by the first predetermined value derived from the transmission power level control word include:

means for applying a portion of the transmission power level control word to a look-up table;

means for generating a multiplicand with said look-up table based on said portion of the transmission power level control word; and means for multiplying said digital signal by said multiplicand.

8. The system as claimed in claim 6, further comprising means for applying a bit stream to an information symbol mapper to produce said digital signal, and wherein said information symbol mapper is a baseband quadrature symbol mapper and the digital signal produced by said baseband quadrature symbol mapper comprises an in-phase digital signal and a quadrature digital signal, and further wherein said means for compressing said digital signal by multiplying said digital signal by the first predetermined value include means for multiplying both the in-phase and quadrature signals by said first predetermined value.

9. The system as claimed in claim 8, wherein said means for converting the digital signal to the analog signal converts both the in-phase and quadrature signals, said system frequency comprising:

means for applying the analog in-phase and quadrature signals to a quadrature direct modulator to produce a single intermediate frequency signal;

means for upconverting and filtering the intermediate frequency signal to produce a radio frequency signal; and means for applying the radio frequency signal to said analog transmission power amplifier.

10. A system for controlling the transmission power level of a modulated carrier signal transmitter comprising:

means for compressing a digital signal to be transmitted by multiplying said digital signal by a first predetermined value;

means for modulating a carrier signal based on the compressed digital signal;

means for inputting said modulated carrier signal to a transmission power amplifier;

means for adjusting the gain of said transmission power amplifier on the basis of a second predetermined value; and means for transmitting the amplified modulated carrier signal;

said first and second predetermined values being derived from a digital transmission power level control word which comprises n bits, wherein n is an integer;

said first predetermined value is derived from k bits of said n bits, where k is an integer that is less than n; and said second predetermined value is derived from the remaining n–k bits of said n bits.

11. A system for controlling the transmission power level of a modulated carrier signal transmitter comprising:

means for applying a bit stream to an information symbol mapper to produce a digital signal to be transmitted, said information symbol mapper being a baseband quadrature symbol mapper and the digital signal produced by said baseband quadrature symbol mapper comprises an in-phase digital signal and a quadrature digital signal;

means for compressing said digital signal by multiplying said digital signal by a first predetermined value including means for multiplying both the in-phase and quadrature signals by said predetermined value;

means for modulating a carrier signal based on the compressed digital signal;

means for inputting said modulated carrier signal to a transmission power amplifier;

means for adjusting the gain of said transmission power amplifier on the basis of a second predetermined value; and means for transmitting the amplified modulated signal; said system further comprising means for multiplexing the in-phase and quadrature signals prior to compressing said digital signal and converting the signals from digital to analog; and means for demultiplexing the in-phase and quadrature signals following compression and digital to analog-conversion.

* * * * *